(12) United States Patent
Iranmanesh

(10) Patent No.: US 6,445,049 B1
(45) Date of Patent: Sep. 3, 2002

(54) CELL BASED ARRAY COMPRISING LOGIC, TRANSFER AND DRIVE CELLS

(75) Inventor: Ali Akbar Iranmanesh, Sunnyvale, CA (US)

(73) Assignee: Artisan Components, Inc., Sunnyvale, CA (US)

( * ) Notice: Subject to any disclaimer, the term of this patent is extended or adjusted under 35 U.S.C. 154(b) by 0 days.

(21) Appl. No.: 09/163,890

(22) Filed: Sep. 30, 1998

Related U.S. Application Data

(63) Continuation-in-part of application No. 08/885,148, filed on Jun. 30, 1997, now Pat. No. 6,177,709.
(60) Provisional application No. 60/060,417, filed on Sep. 30, 1997.

(51) Int. Cl.$^7$ .......................... H01L 27/11; H01L 27/18
(52) U.S. Cl. ...................... 257/401; 257/390; 257/206; 257/207; 257/208; 257/211; 257/903; 257/904; 257/392; 257/212
(58) Field of Search .................. 257/202–211, 903, 257/904, 392, 390, 401

(56) References Cited

U.S. PATENT DOCUMENTS

| | | | |
|---|---|---|---|
| 4,314,265 A | | 2/1982 | Simko |
| 4,815,040 A | * | 3/1989 | Matsui et al. ............... 365/203 |
| 4,816,887 A | * | 3/1989 | Sato |
| 4,987,530 A | * | 1/1991 | Wagner et al. .............. 364/200 |
| 5,083,178 A | * | 1/1992 | Otsu .......................... 357/40 |
| 5,172,016 A | | 12/1992 | Dobberpuhl |
| 5,189,322 A | | 2/1993 | Chan et al. |
| 5,289,021 A | * | 2/1994 | El Gamal ................... 257/206 |
| 5,300,790 A | * | 4/1994 | Hirabayashi et al. ....... 257/202 |
| 5,317,407 A | | 5/1994 | Michon |
| 5,324,996 A | | 6/1994 | Mote, Jr. |
| 5,352,936 A | | 10/1994 | Allen |
| 5,399,917 A | | 3/1995 | Allen et al. |
| 5,420,447 A | * | 5/1995 | Waggoner ................... 257/206 |
| 5,434,531 A | | 7/1995 | Allen et al. |
| 5,499,211 A | | 3/1996 | Kirihata et al. |
| 5,543,733 A | | 8/1996 | Mattos et al. |
| 5,565,794 A | | 10/1996 | Porter |
| 5,570,043 A | | 10/1996 | Churchill |
| 5,574,389 A | | 11/1996 | Chu |
| 5,608,275 A | | 3/1997 | Khosrowpour |
| 5,635,731 A | * | 6/1997 | Ashida ........................ 257/67 |
| 5,635,860 A | | 6/1997 | Westerwick |
| 5,754,467 A | * | 5/1998 | Ikeda et al. ................. 257/390 |
| 5,754,568 A | * | 5/1998 | Hobson ...................... 365/156 |
| 5,870,408 A | * | 2/1999 | Aggarwal et al. .......... 324/757 |
| 5,949,706 A | * | 9/1999 | Chang et al. ................ 257/903 |
| 6,144,241 A | * | 11/2000 | Wong .......................... 257/204 |
| 2001/0011734 A1 | * | 8/2001 | Kanamoto et al. .......... 257/202 |

FOREIGN PATENT DOCUMENTS

| | | | |
|---|---|---|---|
| EP | 0647030 A2 | * | 9/1994 |
| JP | 9-289251 | * | 11/1997 |

* cited by examiner

*Primary Examiner*—Alexander O. Williams
(74) *Attorney, Agent, or Firm*—Martine & Penilla, LLP

(57) ABSTRACT

A highly flexible, heterogeneous architecture for portable, high density, high performance standard cell and gate array applications is disclosed. The architecture is based on the three basic cells and their derivatives, particularly a transmission gate cell, a logic cell, and a drive cell. For gate array implementations, the cells are arranged in a pre-determined regular array format. For standard cell implementations, the arrangement of the cells may be optimized to suit each target logic gate. Optimized transistor sizing is achievable through leaf cells, software sizing, or both.

12 Claims, 14 Drawing Sheets

T   L   D

CELL BASED ARRAY COMPRISING LOGIC, TRANSFER AND DRIVE CELLS

RELATED APPLICATION

This application claims the benefit of U.S. Provisional Patent Application having Ser. No. 60/060,417, filed on Sep. 30, 1997, entitled "Cell Based Array Comprising Logic, Transfer and Drive Cells." This application is continuation-in-Part of U.S. patent application Ser. No. 08/885,148, filed Jun. 30, 1997, now U.S. Pat. No. 6,177,709, issued Jan. 23, 2001, entitled Cell Based Array Having Compute/Drive Ratios of N:1 and commonly assigned herewith, incorporated herein by reference.

FIELD OF THE INVENTION

This application relates to designs for cell based arrays, and particularly relates to low power, high density designs for cell based arrays.

BACKGROUND OF THE INVENTION

The use of gate arrays and standard cells has become well known as an effective and efficient method for rapidly developing new semiconductor products of substantial complexity. Such standard cells are typically used in cell-based arrays, and have wide application within the industry. A widely-accepted design for a gate array architecture that provides standard cell type densities is based on the design described in U.S. Pat. No. 5,289,021, commonly assigned to the assignee of the present invention and incorporated herein by reference.

However, despite the many advantages offered by cell based arrays, prior art designs cells have suffered from some limitations which have become more apparent as line widths have been reduced and complexity has increased. In particular, the typical prior art standard cell has been limited to a relatively low ratio between compute and drive cells. More specifically, prior art designs have limited the ratio between compute and drive cells to no more than three- or four-to-one. Moreover, manufacturing limitations have served to impose a fixed, three-to-one limitation on most if not all prior art designs. Although the three-to-one ratio has enabled efficient construction of a great many circuits, and is particularly well suited to many high performance designs, there remain other applications—for example, low power applications—which could benefit from a ratio of compute to drive cells other than (and typically greater than) three-to-one.

In addition, the nature of the compute and drive cell paradigm typically involves the use of only two types of cells to achieve all intended functions. While this has been and will continue to be very successful for a great many designs, demands for increasing density and lower power consumption make desirable cell designs which can meet these increasingly difficult objectives.

As a result, there has been a need to develop a cell based array design which permits the implementation of high density, lower power designs which use more efficiently the available die area.

SUMMARY OF THE INVENTION

The present invention substantially overcomes the limitations of the prior art by providing a highly flexible, heterogeneous architecture for portable, high density standard cell and gate array applications. More specifically, the present invention provides a trio of dense and flexible building blocks for improved implementation of logic cells. The building blocks comprise specialized cells which are sizeable and yet tailored to the particular functions they will likely be asked to perform. By combining the flexibility offered by the plurality of cell types, density can be better optimized while at the same time offering either higher performance or lower power operation.

The present invention achieves the foregoing objectives by providing three different types of cells (and their derivatives) for performing specialized functions, referred to sometimes hereinafter as transmission gate (T), logic (L) and drive (D) cells and, in the aggregate, as TLD cells. Each of the three types of cells are made through compilation via leaf cells; a wide range of transistor sizing is possible through leaf cells and via software.

The trio of TLD cells can be arranged in a predetermined array format for use as a gate array. For standard cell solutions, the arrangement of the building blocks can be optimized freely to suit each target logic gate.

The transmission gate (T) cell of the present invention typically comprises two pair of small, sizeable, CMOS transistors and is intended for mux implementation using CMOS transmission gates or other areas where small devices are required, such as SRAM. Gate connections are typically made through poly-switch-box (PSB) cells. For the sake of avoiding overcomplication, only exemplary forms of T cells will be discussed hereinafter, although it will be apparent to those skilled in the art that various derivatives of the T cell are possible with various styles of abutment.

Logic or L cells, like T cells, are typically comprised of two medium sized, sizeable CMOS transistor pairs. L cells are typically used for general CMOS logic implementation. As with T cells, gate connections are typically made through PSB cells, and various derivatives are included within the scope of the invention including different styles of abutment.

Drive or D cells are typically intended for maximum drive capability, and so comprise larger transistors than either T or L cells. An exemplary D cell comprises two larger, sizeable CMOS transistor pairs. As with the other types of cells, various derivative forms also exist, including various styles of abutment. As noted previously, each type of cell can be created by cell compilation using leaf cells. In addition, each type of cell can be configured with either a straight gate design or a bent gate design. Bent gate designs typically offer greater densities that straight gate designs. In addition, two abutting T cells or L cells can either share the active area (i.e., gate isolated) or can be separated by field isolation.

In accordance with the present invention, the TLD cells can be configured in what may be thought of as four different families of designs. The TLD cells may be combined in a columnar style in either the straight gate or the bent gate version. Alternatively, the TLD cells may be combined in a row style in either the straight gate or the bent gate version. In the columnar style, the T and L cells are typically stacked, and one or more TL pairs are typically arrayed with a D cell. In the row style, the T and L cells are placed laterally adjacent, and again one or more TL pairs may be arrayed with a D cell. The small capacitance of the T cell can be seen to provide improved power and performance over earlier designs, while the larger drive transistors of the D cell of the present invention permits improved drive capability.

The foregoing and other advantages of the present invention may be better appreciated from the following Detailed Description of the Invention, taken together with the attached Figures.

THE FIGURES

DETAILED DESCRIPTION OF THE INVENTION

Figure 1:
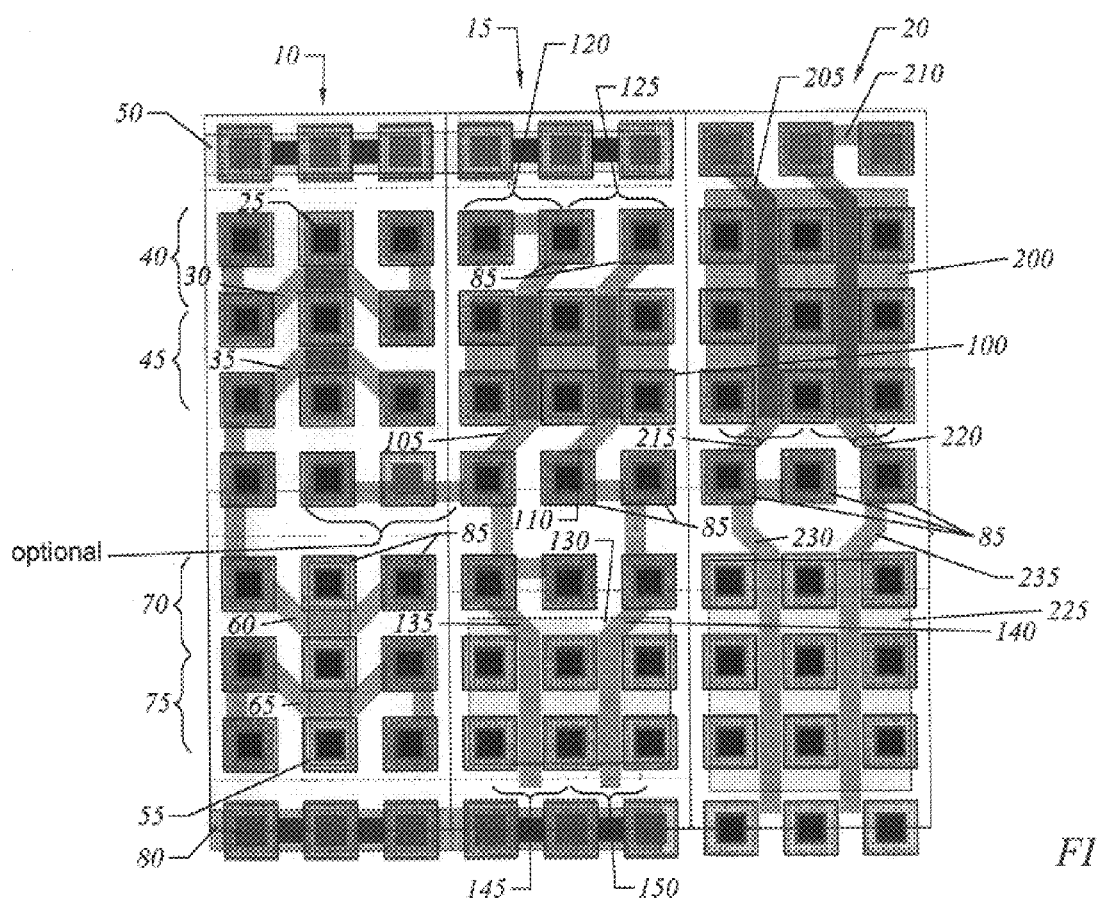
FIG. 1 illustrates in layout form exemplary T, L and D cell implementations.

Referring first to FIG. 1, a transmission gate or T cell indicated generally at 10 is shown adjacent to a logic or L cell indicated generally at 15 and a drive or D cell indicated generally at 20. The upper portion of the T cell 10 includes an N diffusion 25, over which are positioned two gates 30 and 35 to form two transistors 40 and 45. A substrate tap portion 50, such as described in copending application Ser. No. 08/885,148, referred to previously, may also be provided. The gates may be formed of polysilicon and, in at least some embodiments, may be bent to permit increased densities. In other embodiments, the gate polysilicon may be formed in a straight line. These characteristics of the gates 30 and 35 also apply to each of the other gates formed in connection with FIG. 1. It will be appreciated that FIG. 1 illustrates a gate array row structure, which while acceptable in some embodiments is not presently preferred.

Figure 2:
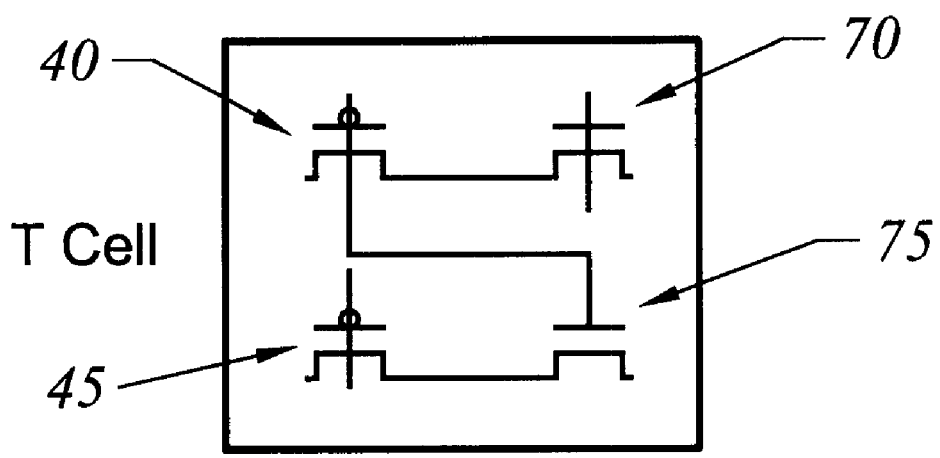
FIG. 2 illustrates in schematic form one embodiment of two pairs of transistors which comprise T cells in accordance with the invention.

The lower portion of the T cell 10 includes a P diffusion 55. Two gates 60 and 65 are formed over the P-type area 55, forming two transistors 70 and 75. An N-diffusion 80 is also provided at the lower edge of the T cell 10 as a contact. A plurality of contact heads 85 (only some of which are indicated in FIG. 1) may be formed in a conventional manner. The T cell 10 may be seen to comprise the two NMOS transistors 40 and 45 and two PMOS transistors 70 and 75, coupled together as shown in FIG. 2. In particular, the gate of PMOS transistor 75 can be seen to be connected to the gate of NMOS transistor 40, while PMOS transistor pair 70 and 75 and NMOS transistor pair 40 and 45 can each be seen to be connected between their respective source and drains. It can be appreciated from the relatively small N-type and P-type areas that the transistors 40, 45, 70 and 75 are small and offer only small fanout but also offer good performance because of their limited capacitance.

Still referring to FIG. 1, and with particular reference to L cell 15, an N-diffusion 100 is formed in the upper portion of the cell. It will be observed that the N diffusion 100 is substantially larger than the corresponding area 25 associated with element 10. A pair of gates 105 and 110 are formed over the N diffusion 100, with multiple contact heads 85 formed as well. The N diffusion 100 and associated gates 105 and 110 can be seen to form two NMOS transistors 120 and 125. The substrate tap 50 can be seen to extend into cell 15. In addition, in some embodiments additional contact heads 85A may be provided within the area of T cell 10.

At the lower portion of the cell 15 a P diffusion 130 is formed and two gates 135 and 140 are formed thereover to create two P-type transistors 145 and 150. The N diffusion 80 can be seen to extend into cell 15. The cell 15 can therefore be seen to form two NMOS transistors 120 and 125, and two PMOS transistors 145 and 150. It will be appreciated that the gates of the various transistors described herein may be formed of polysilicon. The transistors of the L cell 15 can be seen to encompass more area than those of the T cell 10. Gates having a relatively low to medium fanout, for example between one and ten, are typically. implemented with L cells. It will be appreciated by those skilled in the art that, although the areas of the N diffusion and P diffusion shown as forming L cell 15 in FIG. 1 are identical in size, in some embodiments the areas may be varied from one another; for example, in some designs the P diffusion is larger than the N diffusion.

Figure 3:
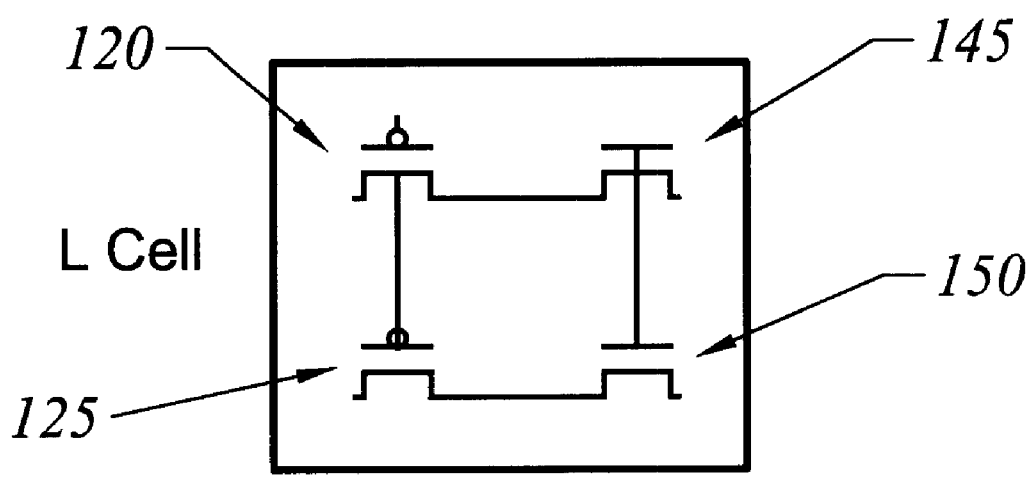
FIG. 3 illustrates in schematic form the interconnection of the transistors which form the D and L cells.

The transistors 120, 125, 145 and 150 can be seen to be interconnected at their respective gates in the manner shown schematically in FIG. 3. Thus, the gates of NMOS transistor 120 and PMOS 145 can be seen to be connected. Similarly, the gates of NMOS transistor 125 and PMOS transistor 150 can be seen to be connected. Each pair of transistors 120, 125 and 145, 150 can be seen to be connected between their source and drain, respectively. It is to be noted that, while a T cell in accordance with the invention can be constructed as shown in FIG. 2, an alternative arrangement of T cell could be that shown in FIG. 3 but with smaller transistors.

With continuing reference to FIG. 1, the D cell 20 can be seen to be implemented in a manner similar to the L cell 15. In particular, a P diffusion 200 is deposited over which two gates 205 and 210 are formed, creating two PMOS transistors 215 and 220. Similarly, an N diffusion 225 is deposited in the lower portion of the D cell 20, over which two gates 230 and 235 are formed to create two NMOS transistors 240 and 245. Various contact heads 85 may be formed for connection among the cells or to other devices. The transistors 215, 220, 240 and 245 which form D cell 20 may be seen to be interconnected in a manner identical to the transistors of L cell 15 (shown in FIG. 3.) However, the transistors of D cell 20 comprise are proportionately larger than those of L cell 15, and are typically used for gates requiring fanouts up to one hundred or perhaps more. The D cells can thus be seen to be intended for maximum fanout.

Figure 4:
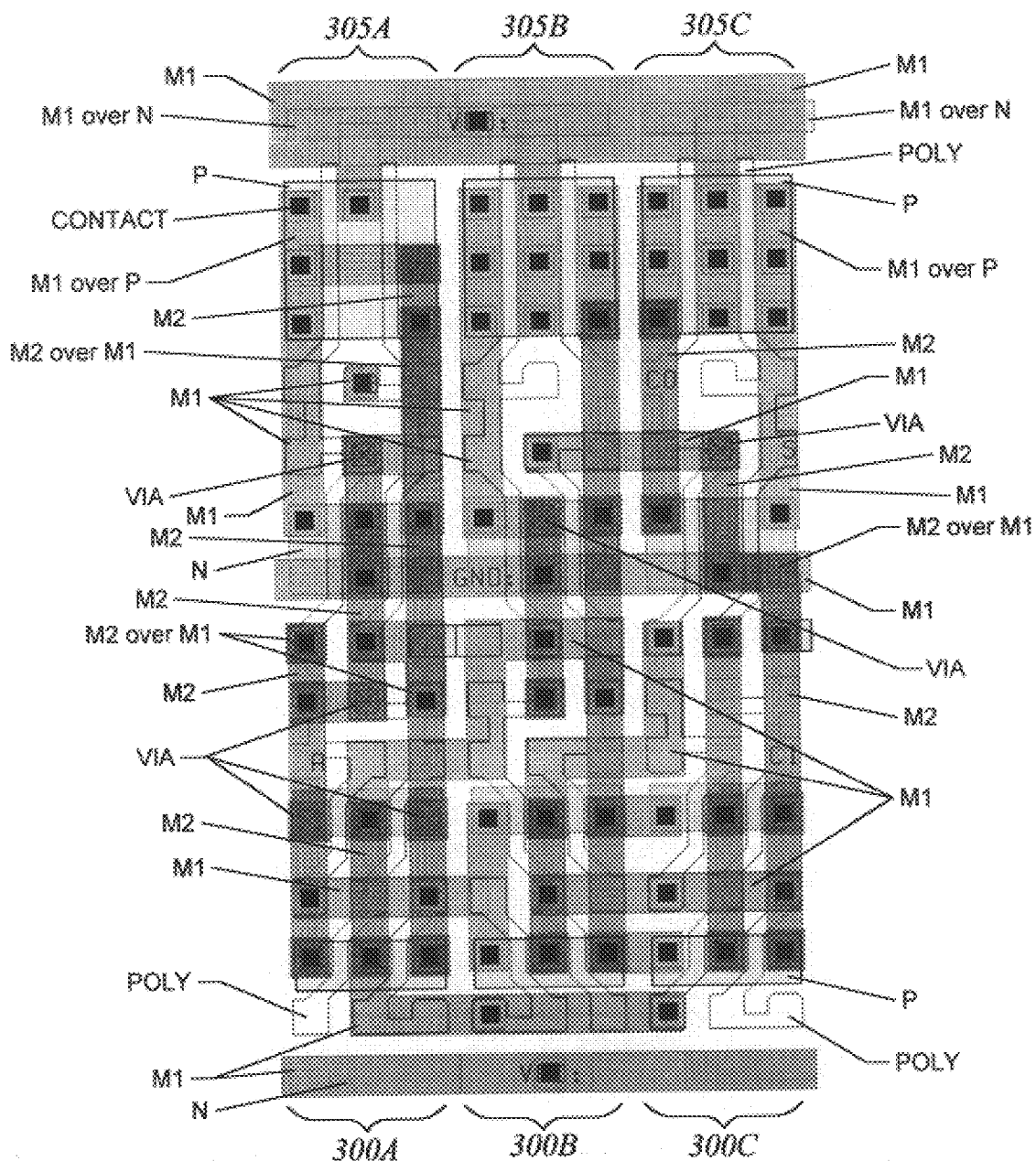
FIG. 4 shows in layout form three T cells and three L cells connected to form a full adder.

Referring next to FIG. 4, a combination of L and T cells are interconnected in a columnar arrangement to form a one bit full adder. In particular, three T cells 300A, 300B and 300C are interconnected with three L cells 305A–305C by two metallization runs, M1 and M2. For purposes of understanding FIG. 4, the following legend applies:

| Reference Character | Layer |
|---|---|
| N | N |
| P | P |
| M1 | M1 |
| M2 | M2 |
| Poly | Poly |
| Contact | Contact |
| Via | Via |

With this arrangement in mind, the interconnection of the cells may be understood.

Figure 5:
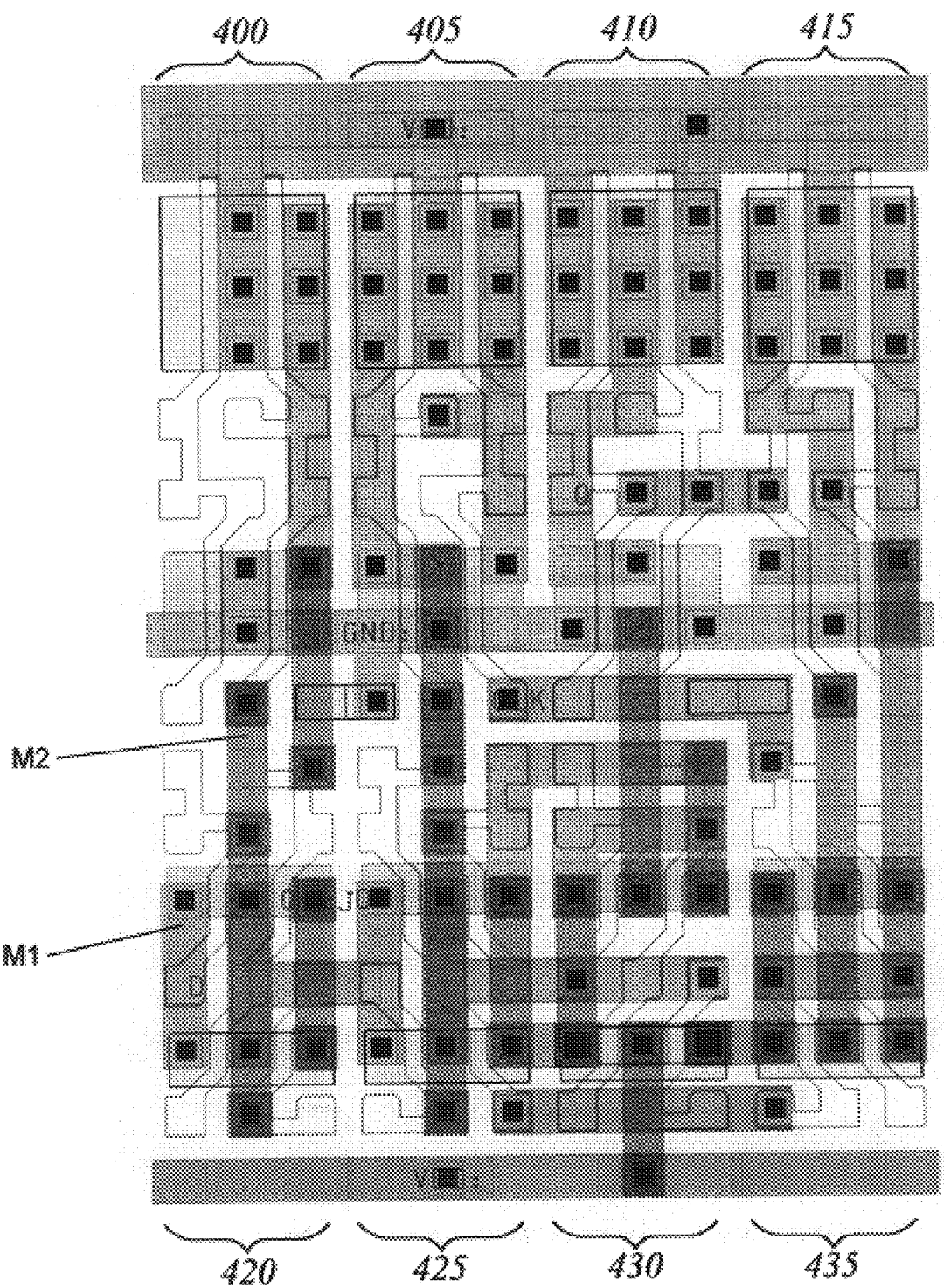
FIG. 5 shows in layout form four T cells and four L cells connected to form a fast enable flip-flop.

Referring next to FIG. 5, combination of four T cells and four L cells are configured to form a fast enable flip-flop. More specifically (and using the legend provided above for FIG. 4), four L cells 400, 405, 410 and 415 are shown arranged vertically above associated T cells 420, 425, 430 and 435 by virtue of first and second metallization runs M1 and M2.

Figure 6:
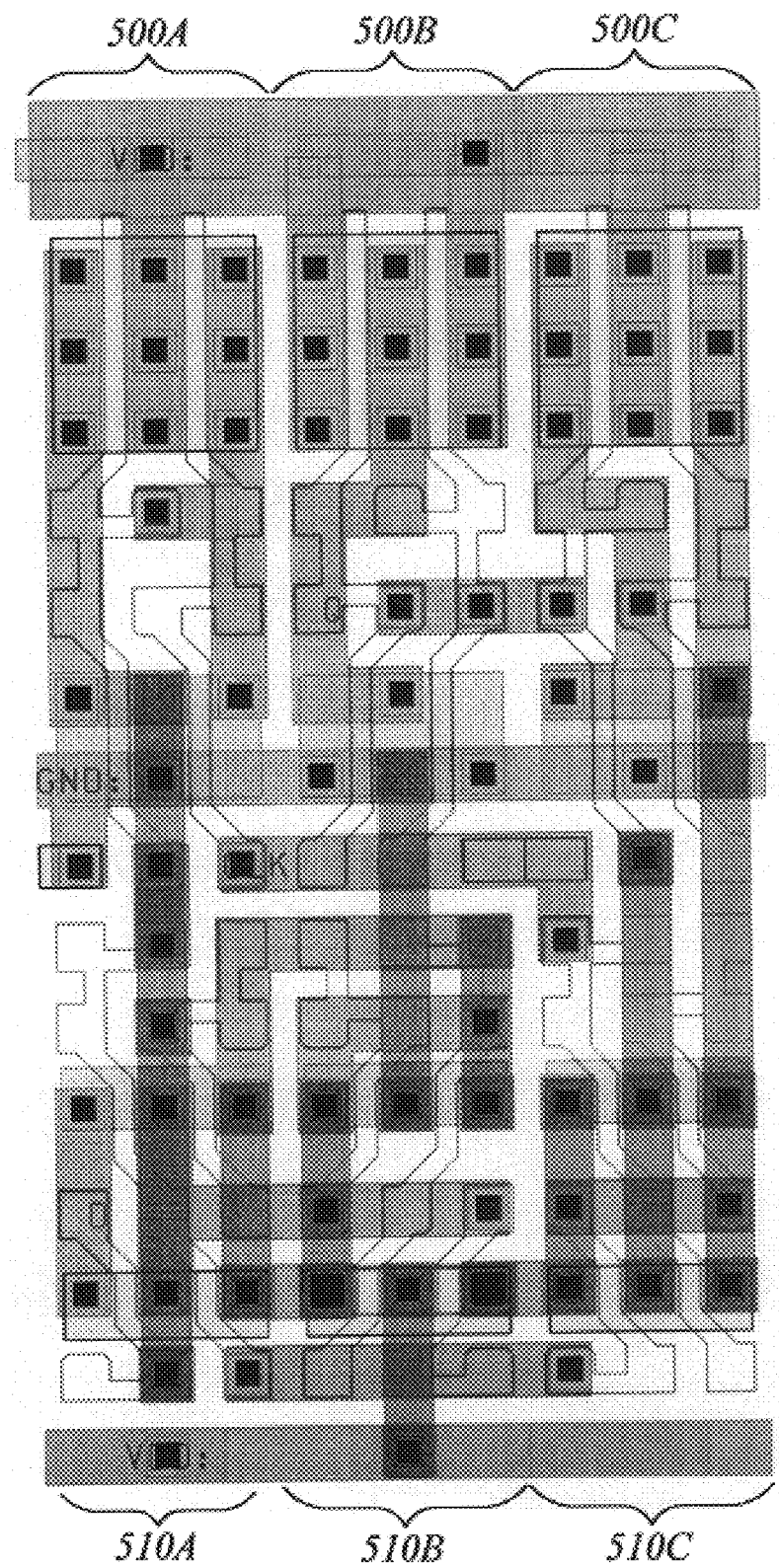
FIG. 6 shows in layout form three T cells and three L cells connected to form a fast D flip-flop.
Figures 7, 8:
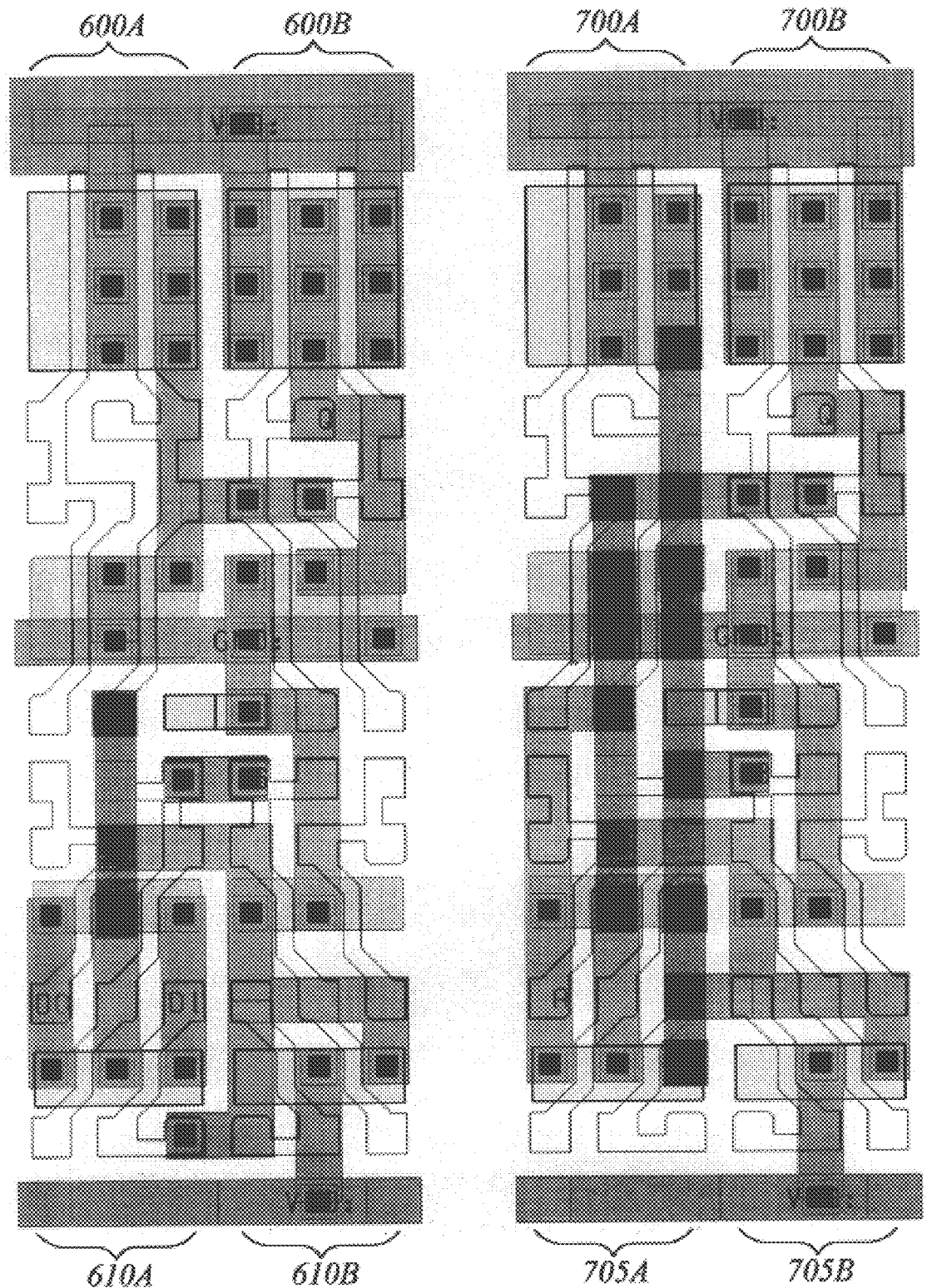
FIG. 7 shows in layout form two T cells and two L cells connected to form a 2:1 mux.
FIG. 8 shows in layout form two T cells and two L cells connected to form a two-input X-OR with one input inverted.

Next, with reference to FIG. 6, a trio of L cells 500A–C are shown interconnected with a trio of T cells 510A–C to form a fast D flip-flop, while in FIG. 7 a pair of L cells 600A–B is arranged in columnar style over a pair of T cells 610A–B to form a 2:1 mux. Similarly, in FIG. 8 a two input X-Or gate with one inverted input is formed in columnar style from a pair of L cells 700A–B interconnected with a pair of T cells 705A–B.

Figure 9:
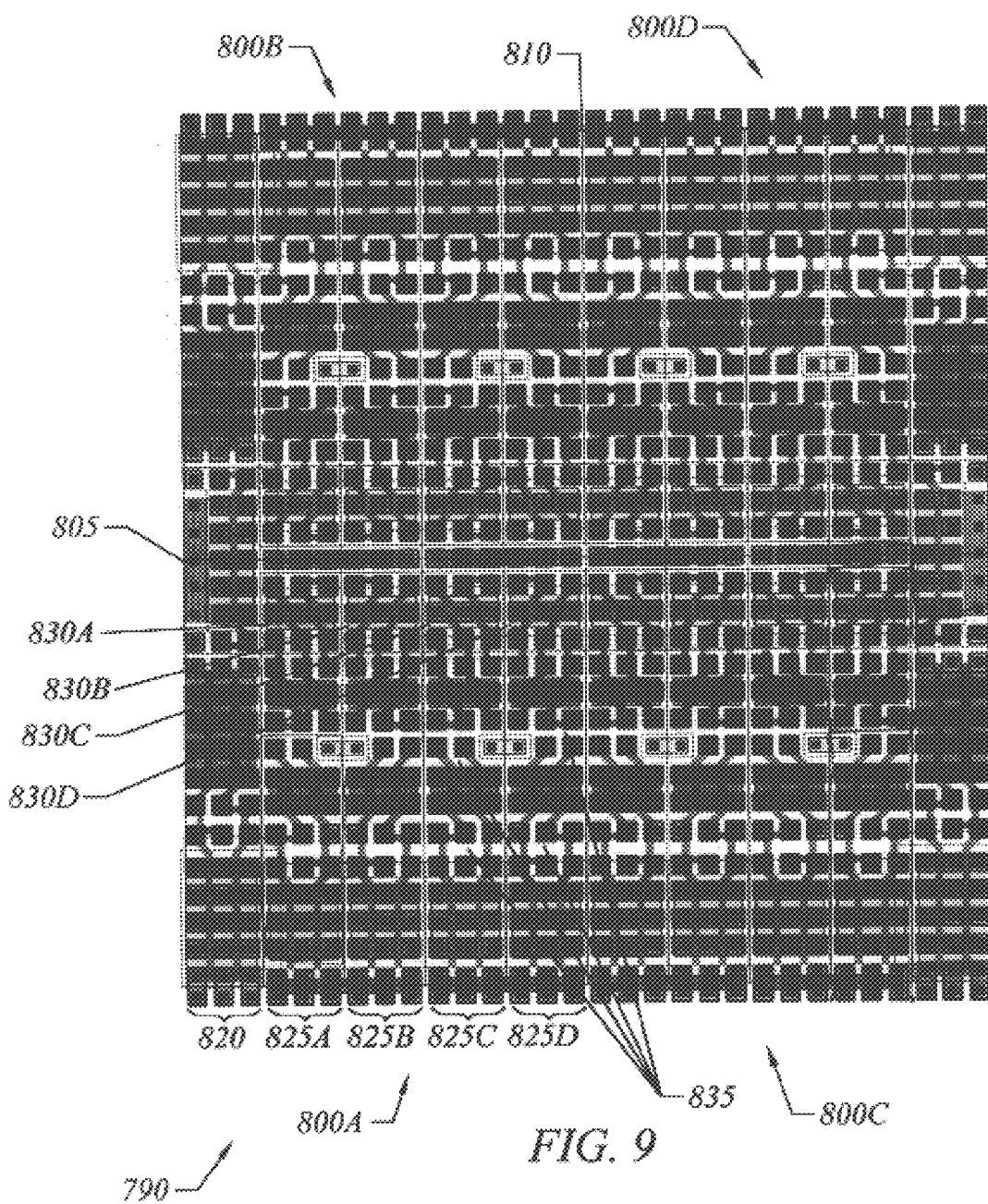
FIG. 9 shows in layout form a basic array comprised of T, L and D cells.

Referring next to FIG. 9, a low voltage standard array 790 is formed from plurality of symmetrically arranged T, L and D cells. In particular, the array can be seen to be configured of four symmetrical quadrants 800A–800D. More specifically, the mirror image of quadrant 800A taken along axis 805 results in quadrant 800B, and the mirror image of quandrants 800A and 800B taken along vertical axis 810 can be seen to form quadrants 800C and 800D. The construction of the entire array can thus be understood from the constituent cells of a single quadrant. For purposes of simplicity, quadrant 800A will be used for illustration.

Referring to quadrant 800A of FIG. 9, the quadrant can be seen to comprise one D cell 820 positioned at the lower left corner, with four L cells 825A–D positioned laterally in a row to the right of the D cell 820. Positioned above each of the D cells is a row of T cells 830A–D. The various transistors are connected by PSBs 835. The standard array of FIG. 9 can be seen to be ready for development of appropriate interconnect layers to define the particular functions performed by the array.

Figure 10:
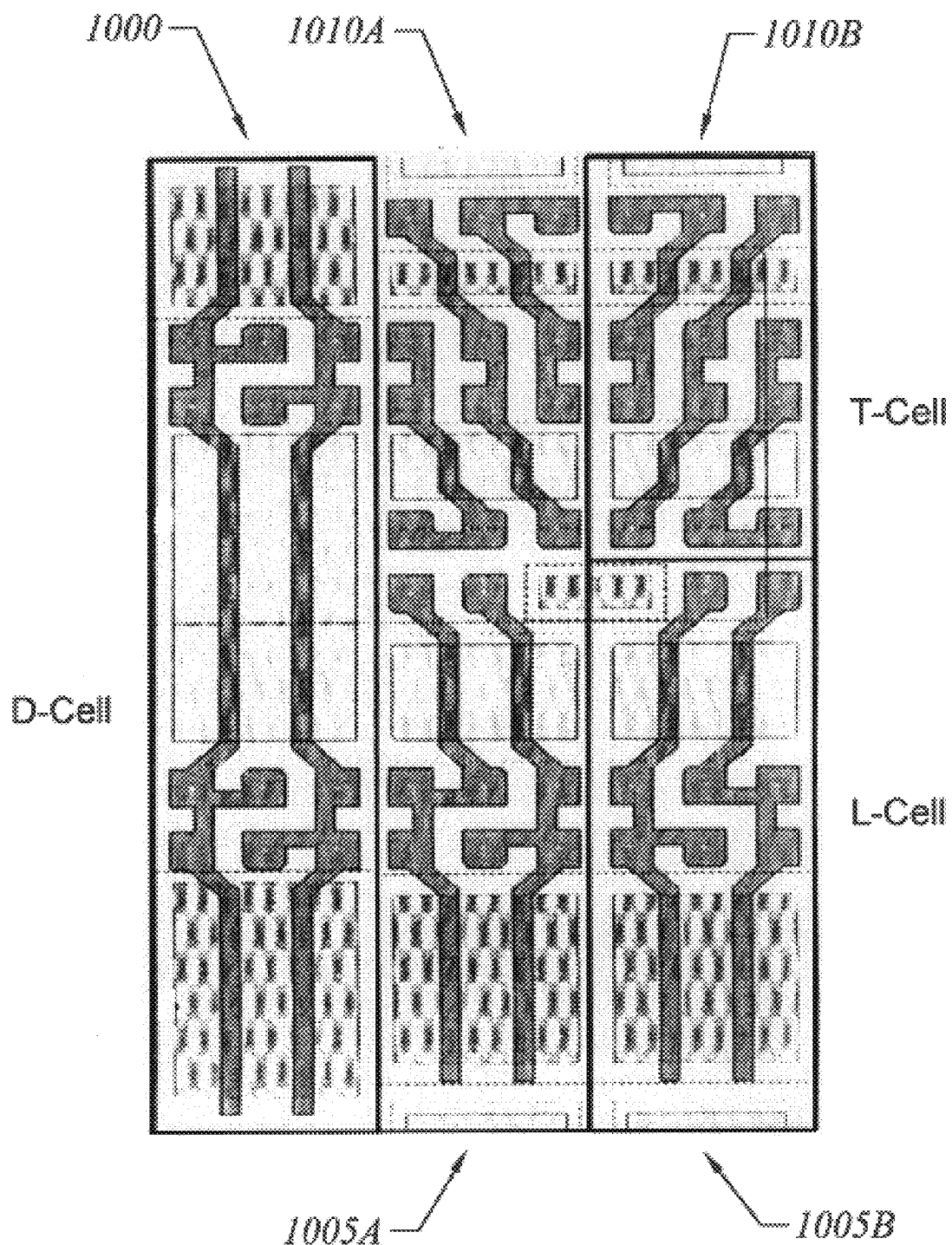
FIG. 10 shows in layout form the TLD building blocks arranged in column style.
Figure 11:
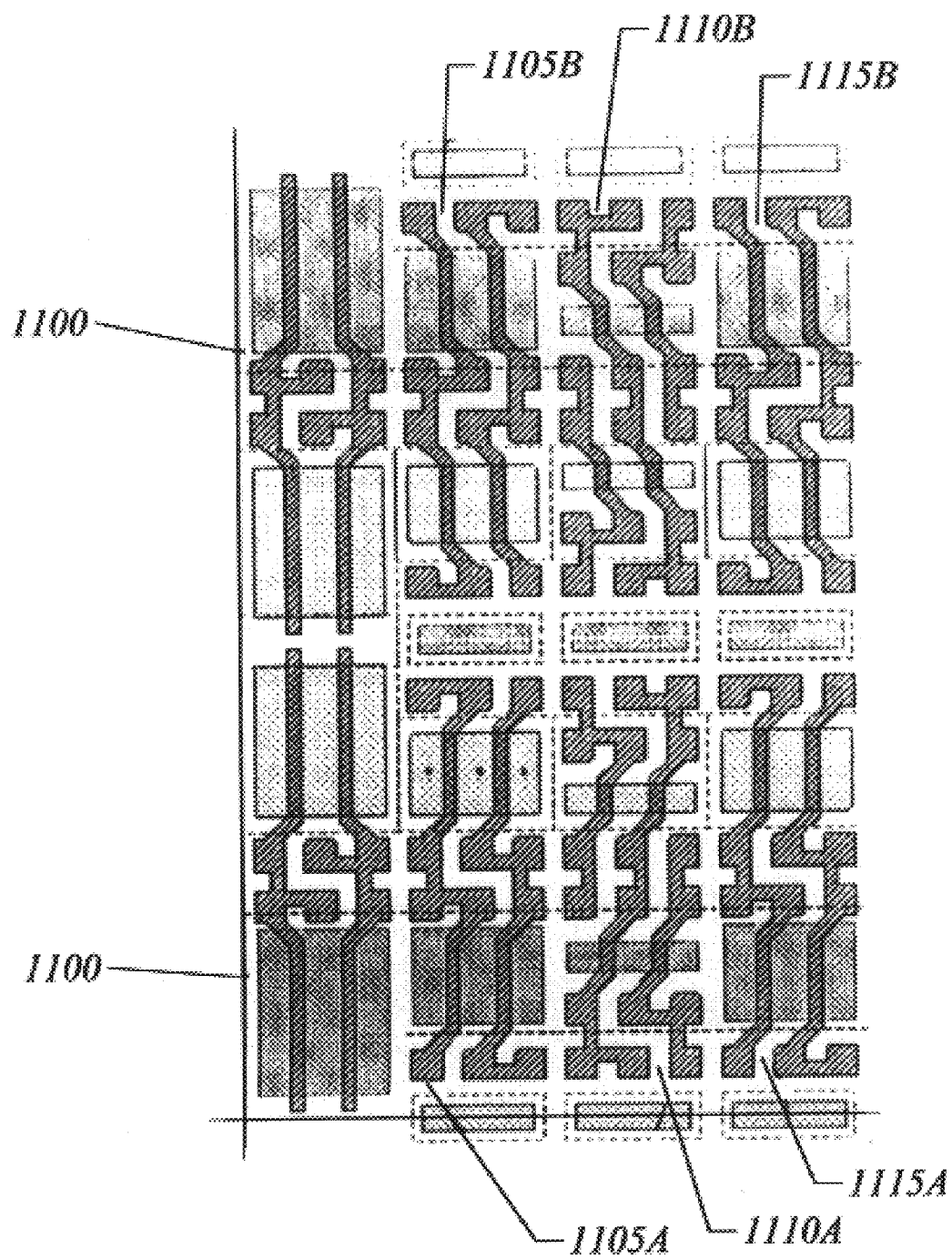
FIG. 11 shows in layout form the TLD building blocks arranged in row style with straight gates.

Referring next to FIGS. 10 and 11, the differences between column and row architectures can be better appreciated. It will be appreciated that, while the structure of FIG. 9 has many desirable features, it is less efficient in its use of area than, for example, the structure of FIG. 10. FIG. 10, which illustrates a presently preferred arrangement of a D cell, shows a D cell 1000 positioned at the left edge of the array, with a pair of L cells. 1005A–B juxtaposed to the right of the D cell 1000. Stacked above the L cells are a pair of T cells 1010A–B, such that each column provides a T-L combination. It can be appreciated that the number of columns of such TL pairs per each D cell can vary widely, and in some applications an array of TL pairs may be appropriate without any D cells. Referring next to FIG. 11, a D cell 1100 is again positioned at the left. However, juxtaposed against the right side of the D cell 1100 is a vertically arranged pair of L cells 1105A–B. Moving rightward, a vertically-arranged pair of T cells 1110A–B is juxtaposed against the L cells 1105A–B. The L-T pattern then repeats with another vertically-arranged pair of L cells 1115A–B. As with the columnar design, the pattern can be repeated as often as desired.

Figure 12:
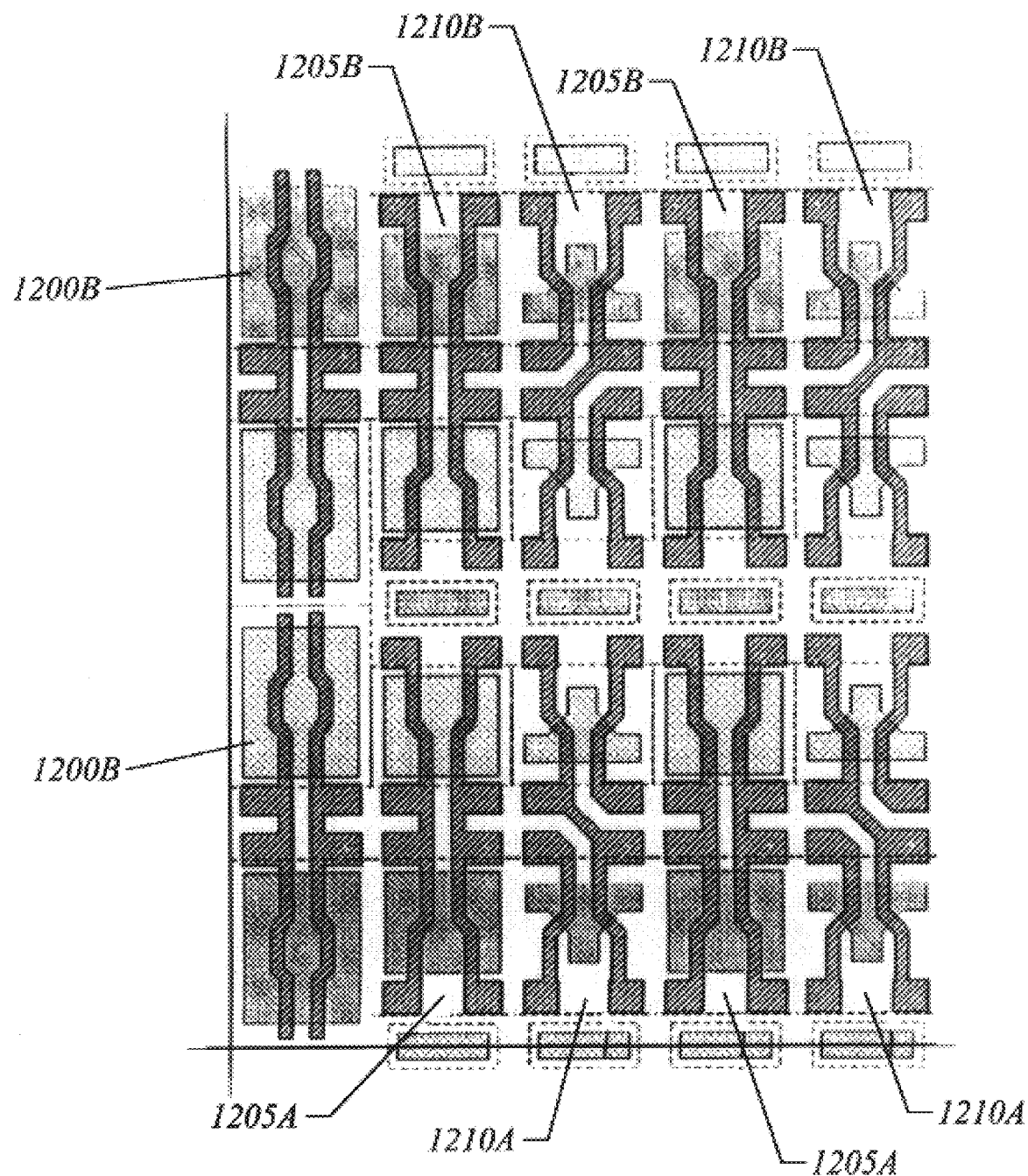
FIG. 12 shows in layout form the TLD building blocks arranged in row style with bent gates.

An additional feature of FIG. 11 is that it shows the implementation of a row structure using a "straight" gate design, and is an arrangement presently preferred over the row structure of FIG. 1. Shown in FIG. 12 is a "bent" gate design using the row architecture, in which a pair of D cells 1200A–B are stacked vertically, with a repeating sequence of vertically arranged pairs of L cells 1205A–B and T cells 1210A–B. It can be appreciated that, in this design, the gate diffusion is arranged at an angle through a portion of the gate structure. For those implementations which allow bent gate structures, FIG. 12 offers more efficient use of area than FIG. 11.

Figure 13:
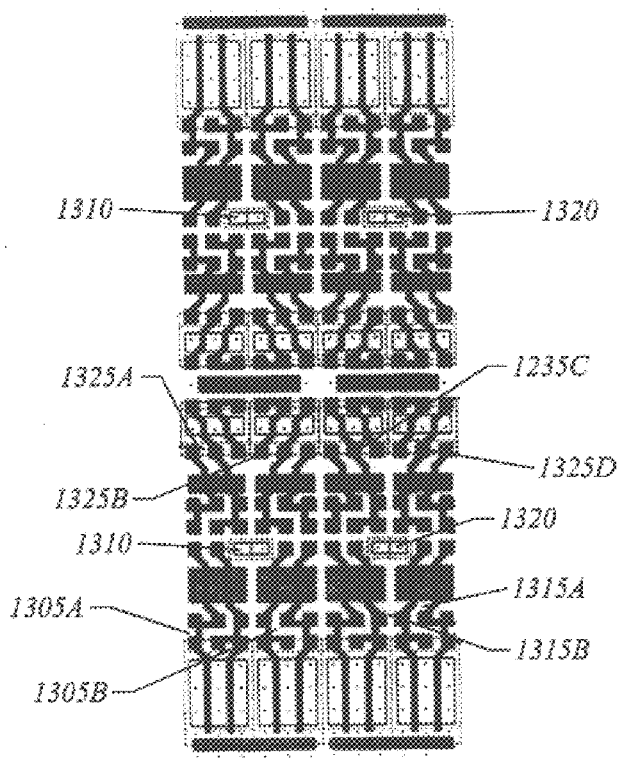
FIG. 13 shows in layout form a first embodiment of a base array style with T and L cells arranged in straight gate, mirrored columnar style.

Referring next to FIG. 13, a form of base array style similar to that of FIGS. 9 and 10 is disclosed. In particular, a first pair of L cells comprising L cells 1305A and its mirror 1305B are positioned around a substrate tap 1310. A second pair of mirrored L cells 1315A and 1315B are positioned around a second tap 1320. Disposed vertically above each of the L cells is one of four associated T cells 1325A–D arranged as pairs of mirrored cells in a columnar style. The entire portion of the array, comprising the substrate taps 1310 and 1320 and cells 1305–1325 is then mirrored about a P diffusion 1330 to form a vertically symmetrical array. In the alternative, the lower array of cells could simply repeat vertically above the P diffusion 1330, instead of being mirrored about the diffusion 1330. This would result in one row of T cells and one row of L cells being adjacent the diffusion 1330.

Figure 14:
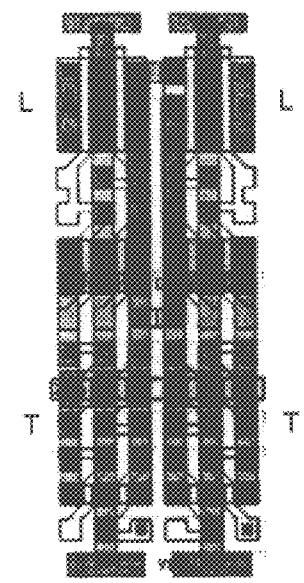
FIG. 14 shows in layout form a low voltage SRAM cell comprised of T and L cells.

Next, with reference to FIG. 14, there is shown therein a combination of two T cells and two L cells arranged to provide a low voltage SRAM cell. The interconnections are similar to those shown in FIGS. 4–8 and are typically provided by metal runs.

Figure 15:
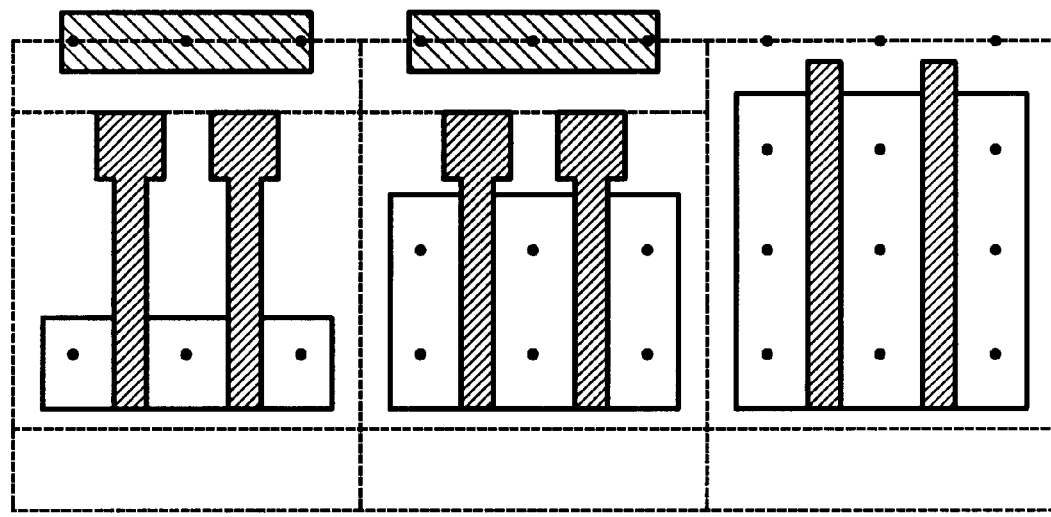
FIG. 15 shows in layout form an exemplary arrangement of T, L and D building blocks arranged in straight gate, row style.
Figure 15:
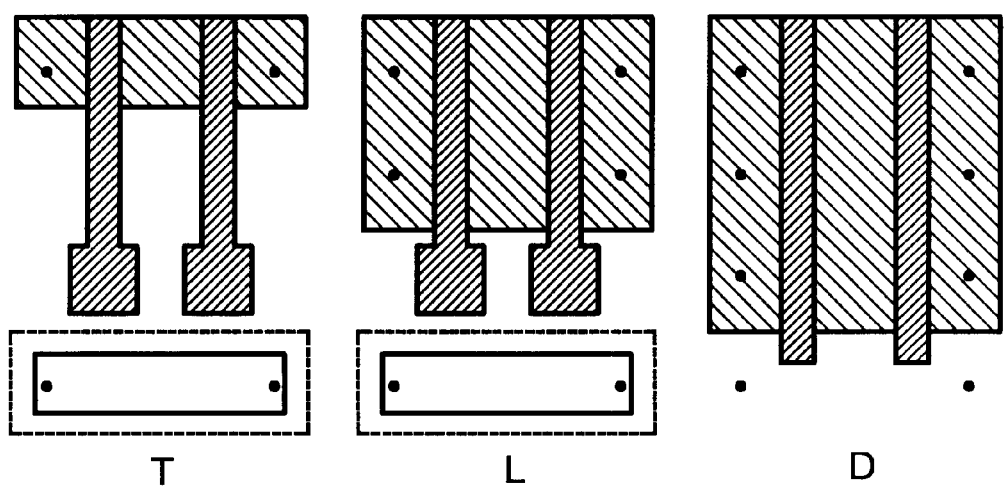

Referring next to FIG. 15, exemplary styles of T, L and D cells for a row-based, straight gate style for use in standard cell designs are shown. The examples shown in FIG. 15 omit entirely the poly switch boxes typically used to connect the various elements, although those skilled in the art will recognize that such switch boxes may be provided in any desired arrangement.

Figure 16:
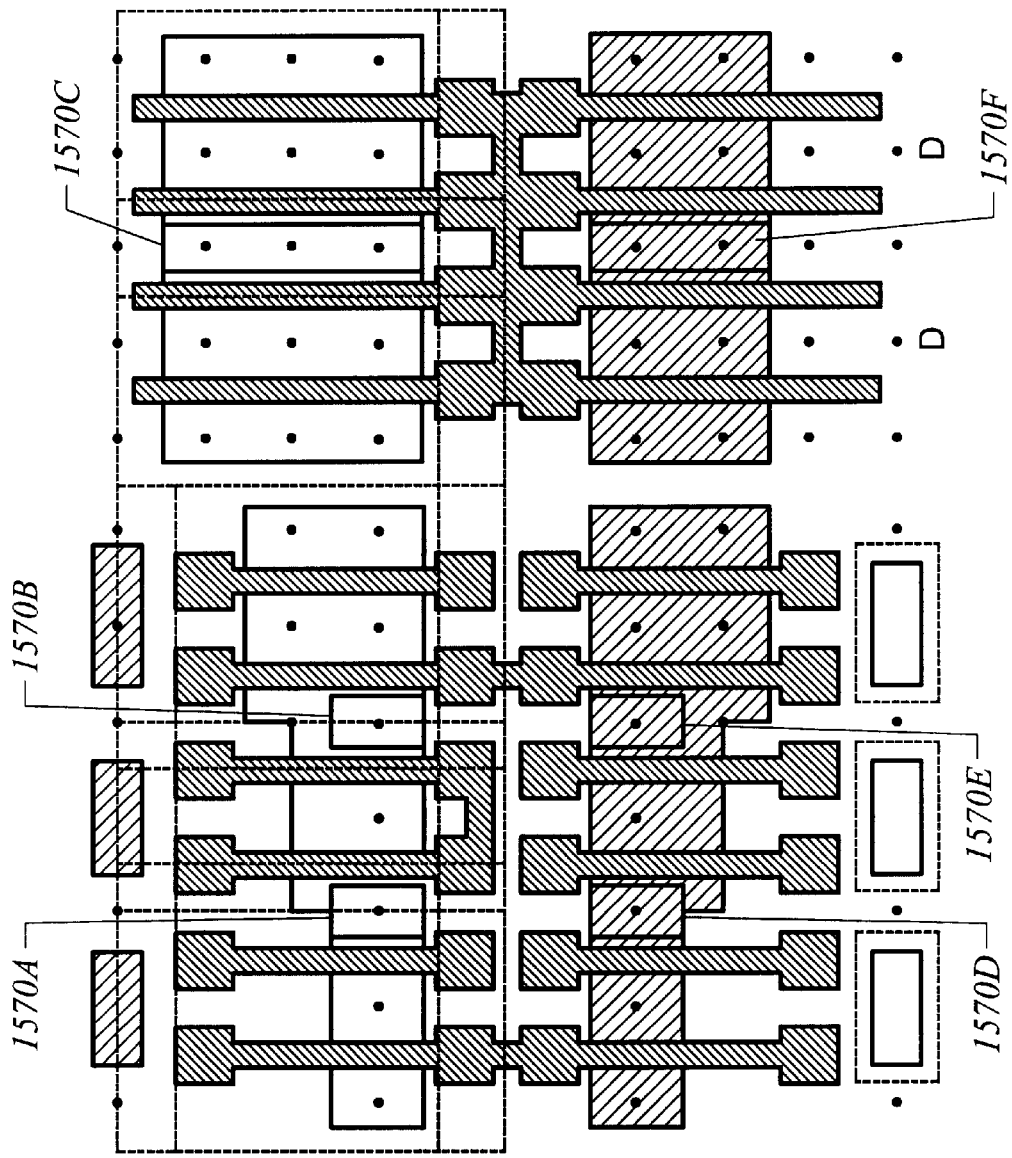
FIG. 16 shows in layout form an exemplary arrangement of T, L and D cells arrange as a base standard cell.

In FIG. 16, an exemplary base arrangement for a standard cell may be seen, where the gate polysilicon is again deposited in a straight line and a plurality of poly switch boxes are shown whereby highly automated routing processes may be implemented. In particular, a pair of D cells 1605 can be seen disposed at the right side of the figure, and an trio alternating L and T cells juxtaposed thereagainst. The variety of such poly switch boxes 1570A–F shown in FIG. 16 can be seen to provide a simple means for interconnecting the adjacent cells to provide any desired functions. The permutations of connections shown in FIG. 16 is not intended to be limiting, and all mathematically possible permutations may find use in appropriate designs.

Figure 17:
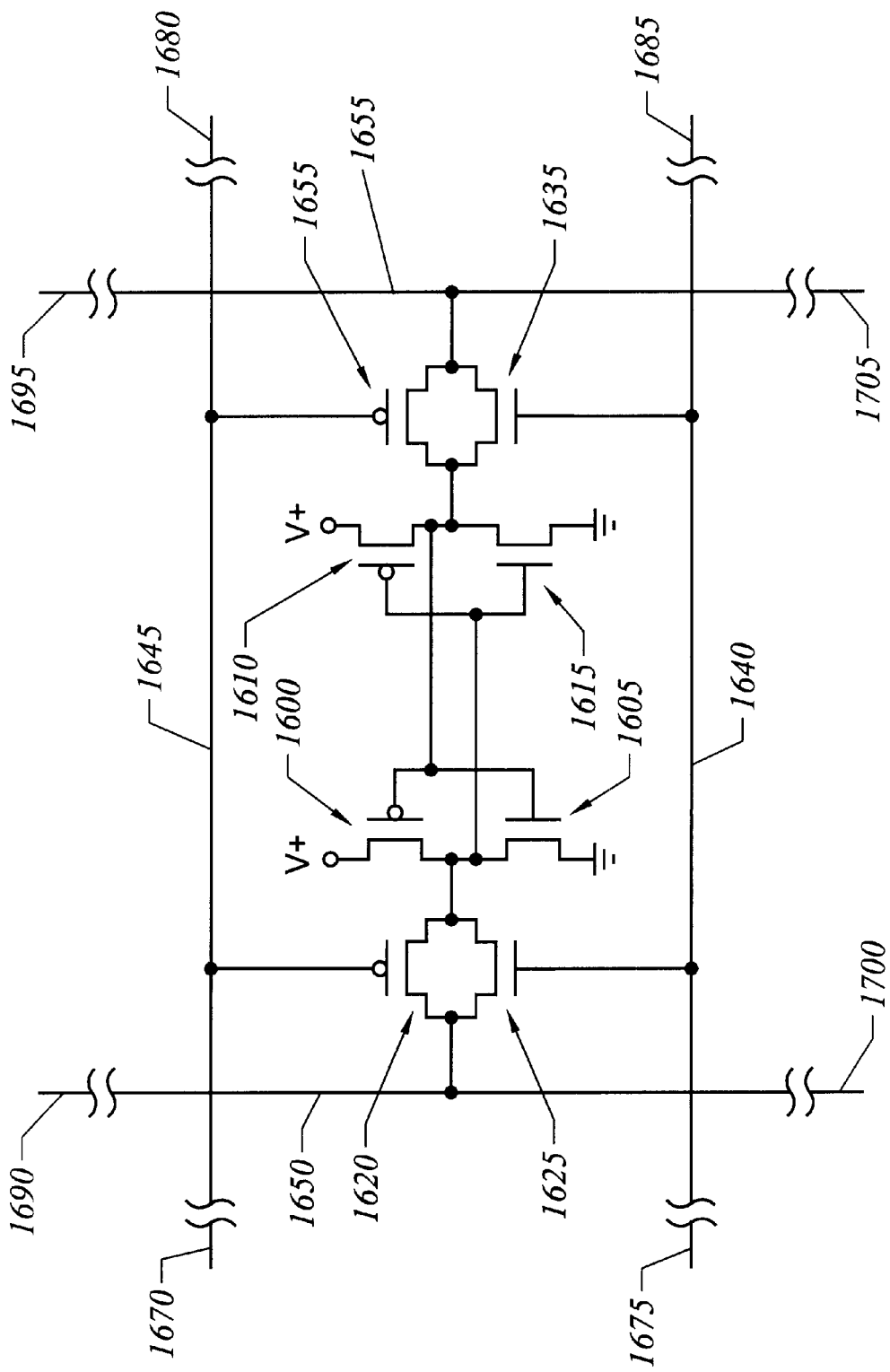
FIG. 17 shows in schematic form the SRAM cell of FIG. 14.

Referring to FIG. 17, an exemplary SRAM cell is shown comprising a combination of cells using the TLD architecture. The cells used may both all T-cells, all L-cells, or comprise a combination of T-cell and L-cells. The SRAM cell is comprised of eight metal oxide semiconductor field effect transistors (MOSFETs) 1600–35. MOSFETs 1600, 1610, 1620 and 1630 are P-channel devices, while MOSFETs 1605, 1615, 1625 and 1635 are N-channel.

MOSFETs 1600 and 1605 are connected to form a first complimentary metal oxide semiconductor (CMOS) inverter and MOSFETs 1610 and 1615 are connected to form a second CMOS inverter. The first and second inverters are cross-coupled (i.e., the output of one is connected to the input of the other) to form a circuit capable of statically holding one bit of information. The two states of the cross-coupled inverters being: (i) the first inverter having its output voltage at V+ and the second inverter having its output voltage at ground, or (ii) the second inverter having its output voltage at V+ and the first inverter having its output voltage at ground. Typically, an output voltage of V+ represents a logical "1" while an output voltage of ground represents a logical "0." For the purposes of this patent, state (i) is defined as storing a logical 1 while state (ii) is defined as storing a logical 0.

The state of the cross-coupled inverters is changed by applying, to the input of each inverter, a voltage level opposing the voltage level currently being applied to that input by the other inverter. For example, assume that the cross-coupled inverters are currently in state (i). This implies that the first inverter is receiving a ground voltage at its input from the second inverter and the second inverter is receiving a V+ voltage at its input from the first inverter. Changing the cross-coupled inverters to state (ii) is therefore accomplished by applying a V+ voltage to the input of the first inverter and a ground voltage to the input of the second inverter. The voltage sources applied to change the state of the cross-coupled inverters must be of sufficiently low internal resistance to overcome the drive capability of the cross-coupled inverters and "force" the input of each inverter to the newly desired voltage level.

MOSFETs 1620 and 1625 are connected to form a first CMOS transmission gate and MOSFETs 1630 and 1635 are connected to form a second CMOS transmission gate. In a CMOS transmission gate, applying a V+ voltage to the gate of the N-channel MOSFET and a ground voltage to the gate of the P-channel MOSFET puts the transmission gate in a conductive (or "on") state, while applying a ground voltage to the gate of the N-channel MOSFET and a V+ voltage to the gate of the P-channel MOSFET puts the transmission gate in a nonconductive (or "off") state.

The first and second transmission gates are used to access the state of the cross-coupled inverters, both for the purposes of reading their state and writing a new state. The first and second transmission gates are turned on by applying a V+ voltage to word-line 1640 and a ground voltage to complimentary word-line 1645. The cross-coupled inverters can then be read from or written to via bit-line 1650 and complimentary bit-line 1655.

While FIG. 17 shows only a single SRAM cell, but it is well known in the art that multiple SRAM cells can arranged as an array. As part of a two-dimensional array, each pair of a word-line and its compliment defines a row and each pair of a bit-line and its compliment defines a column. A particular SRAM cell is accessed by asserting a word-line pair (enabling the transmission gates for all the SRAM cells in a row) and then reading or writing a particular SRAM cell in the selected row through a bit-line pair.

The row defined by word-line 1660 and complimentary word-line 1665 of FIG. 17 can be continued to the left by wire segments 1670 and 1675 or continued to the right by wire segments 1680 and 1685. The column defined by bit-line 1650 and complimentary bit-line 1655 of FIG. 17 can be continued upwards by wire segments 1690 and 1695 or continued downwards by wire segments 1700 and 1705.

Peripheral circuitry for selecting a word-line pair and for reading or writing through a bit-line pair is well known in the art. However, the present invention introduces a complimentary word-line (such as complimentary word-line of FIG. 17) not known in the art. The complimentary word-line is necessary since the present invention is read from or written through via fully complimentary transmission gates. The use of fully complimentary transmission gates means that the present invention can operate at much low voltages than prior art SRAM cells which are typically read or written to through transmission gates formed of only an N-channel MOSFET. At low voltages, the N-channel MOSFET is only suitable for transmitting a ground voltage while the P-channel MOSFET is only suitable for transmitting a V+ voltage. This is due to the fact that a V+ voltage transmitted through an N-channel device will be lowered by the device's threshold voltage and, in a complimentary fashion, a ground voltage transmitted through a P-channel device will be raised by the P-channel device's threshold voltage.

As noted previously, many variations of the foregoing examples are possible using different arrangements of leaf cells. Some of these include:

Basic cells, non-sharing
Half cells, non-sharing
Full cells, one side sharing
Full cells, both sides sharing
Half cells, one side sharing
Half cells, both sides sharing
Diff. Leaf Cell for Transistor Sizing
PSB, both gates connected
PSB, both gates unconnected
PSB, one gate connected
PSB, gates cross-connected
PSB, all gates connected
PSB, all gates connected and extended
PSB, all gates connected and fully extended
PSB, for half cells, gates connected
PSB, for half cells, gates open Other arrangements are straightforward in view of the foregoing examples.

From the foregoing, it can be appreciated that a new and novel technique for providing high density, low power standard cell and gate array structures has ben disclosed. The technique also has the advantage, in at least some embodiments, of permitting better routability and yield. Having fully described one embodiment of the present invention, it will be apparent to those of ordinary skill in the art that numerous alternatives and equivalents exist which do not depart from the invention set forth above. It is therefore to be understood that the invention is not to be limited by the foregoing description, but only by the appended claims.

I claim:

1. A set of cells for creating cell based applications, comprising:

a transmission gate cell, wherein the transmission gate cell includes a plurality of transistors of a first size;

a logic cell, wherein the logic cell includes a plurality of transistors of a second size, the second size being larger than the first size; and a drive cell, wherein the drive cell includes a plurality of transistors of a third size, the third size being larger than the second size, wherein one or more cells of the set of cells can be used to build the cell based application.

2. A set of cells as recited in claim 1, wherein one or more cells is configured in a straight gate design.

3. A set of cells as recited in claim 1, wherein one or more cells is configured in a bent gate design.

4. A set of cells as recited in claim 1, wherein a transmission gate cell and an adjacent logic cell share an active area.

5. A set of cells as recited in claim 1, wherein a transmission gate cell and an adjacent logic cell are separated by field isolation.

6. A set of cells as recited in claim 1, wherein the transmission gate cell includes two n-channel transistors and two p-channel transistors, wherein a gate of an n-channel transistor is coupled to a gate of a p-channel transistor.

7. A set of cells as recited in claim 1, wherein the logic cell includes two n-channel transistors and two p-channel transistors, wherein a gate of a first n-channel transistor is coupled to a gate of a first p-channel transistor, and wherein a gate of a second n-channel transistor is coupled to a gate of a second p-channel transistor.

8. A set of cells as recited in claim 1, wherein the drive cell includes two n-channel transistors and two p-channel transistors, wherein a gate of a first n-channel transistor is coupled to a gate of a first p-channel transistor, and wherein a gate of a second n-channel transistor is coupled to a gate of a second p-channel transistor.

9. A cell based array, comprising:
one or more transmission gate cells having two n-channel transistors and two p-channel transistors, wherein a gate of an n-channel transistor is coupled to a gate of a p-channel transistor, and wherein the transistors are of a first size.

10. A cell based array as recited in claim 9, further comprising a logic cell having two n-channel transistors and two p-channel transistors, wherein a gate of a first n-channel transistor is coupled to a gate of a first p-channel transistor, and wherein a gate of a second n-channel transistor is coupled to a gate of a second p-channel transistor, and wherein the transistors are of a second size, the second size being larger than the first size.

11. A cell based array as recited in claim 10, further comprising a drive cell having two n-channel transistors and two p-channel transistors, wherein a gate of a third n-channel transistor is coupled to a gate of a third p-channel transistor, and wherein a gate of a fourth n-channel transistor is coupled to a gate of a fourth p-channel transistor, and wherein the transistors are of a third size, the third size being larger than the second size.

12. A method as recited in claim 11, wherein two transmission gate cells and two logic cells are logically interconnecting to create a fast 2:1 mux.

\* \* \* \* \*